United States Patent [19]
Honda et al.

[11] Patent Number: 5,963,416
[45] Date of Patent: Oct. 5, 1999

[54] ELECTRONIC DEVICE WITH OUTER ELECTRODES AND A CIRCUIT MODULE HAVING THE ELECTRONIC DEVICE

[75] Inventors: Toshimitsu Honda; Manabu Takayama; Takayuki Uehara, all of Tokyo, Japan

[73] Assignee: Taiyo Yuden Co., Ltd., Tokyo, Japan

[21] Appl. No.: 08/946,001

[22] Filed: Oct. 7, 1997

[51] Int. Cl.[6] .................................................. H01G 4/005
[52] U.S. Cl. ................................... 361/306.1; 361/306.3; 361/311; 361/321.2; 29/25.42
[58] Field of Search .............................. 361/303, 306.3, 361/305, 311, 312, 313, 314, 321.1, 321.2, 321.3, 321.4, 321.5, 320, 322; 29/25.42

[56] References Cited

U.S. PATENT DOCUMENTS

| | | |
|---|---|---|
| 4,458,294 | 7/1984 | Womack .................................. 361/321 |
| 4,811,162 | 3/1989 | Maher et al. ............................ 361/308 |
| 4,882,656 | 11/1989 | Menzies et al. ....................... 361/393 |
| 5,093,774 | 3/1992 | Cobb ...................................... 361/306 |
| 5,231,558 | 7/1993 | Tatsuta ................................... 361/321 |
| 5,812,363 | 9/1998 | Kuroda et al. ....................... 361/306.3 |
| 5,815,368 | 9/1998 | Sakamoto et al. ................... 361/321.5 |

*Primary Examiner*—Kristine Kincaid
*Assistant Examiner*—Eric W. Thomas
*Attorney, Agent, or Firm*—Oblon, Spivak. McClelland, Maier & Neustadt, P.C.

[57] ABSTRACT

An electronic device including a ceramic element and outer electrodes wherein each of the outer electrodes includes an undercoat layer, an intermediate metal plating layer formed on the undercoat layer and a surface layer formed by metal plating which is formed on the intermediate metal plating layer; the intermediate metal plating layer is extended beyond the edge of the periphery of the undercoat layer to a surface portion of the ceramic element; and the undercoat layer is entirely coated with the intermediate metal plating layer.

19 Claims, 5 Drawing Sheets

ELECTRONIC DEVICE WITH OUTER ELECTRODES AND A CIRCUIT MODULE HAVING THE ELECTRONIC DEVICE

BACKGROUND OF THE INVENTION

1. Field of the Invention

The present invention relates to a structure of an outer electrode for an electronic device such as a chip multilayer capacitor and a circuit module using the electronic device.

2. Discussion of Background

There has been proposed to use an electronic device of ceramics such as a multilayer ceramic capacitor, a chip inductor, a chip thermistor, a chip LC composite device, an array of the above-mentioned product, which is mounted on a printed circuit substrate. For example, as shown in FIG. 3, the multilayer ceramic capacitor has such a structure that outer electrodes 2 are formed at both ends of a ceramic element 1 which is formed by successively stacking dielectric materials and internal electrodes. In order to manufacture a circuit module, the outer electrodes are connected by soldering to solder lands 3a on a printed circuit substrate 3 as shown in FIG. 3. The multilayer ceramic capacitor is so operated that a voltage produced in the printed circuit substrate 3 is applied across the outer electrodes 2 through the solder lands 3a. Namely, it is of a type of so-called a voltage-operable mode wherein the operation is effected by the application of a voltage. As an example of devices belonging to this kind, there are various types of single products and arrays such as transformer parts, LC composite devices, CR composite parts and so on.

As an example of the chip inductor, there is a ferrite bead which is so constructed that outer electrodes 5 are formed at both ends of a ceramic element 4 in which an internal conductor is provided in a rectangular column-like ferrite magnetic material as shown in FIG. 4. The ferrite bead is connected by soldering to solder lands 6b formed near a power line 6a in a printed circuit substrate. The ferrite bead is of a type of, so-called, current-operable mode which is operable by supplying a current to it, namely, it is operated by a current flowing across the outer electrodes 5, through the lands 6b. As an example of devices belong to the ferrite bead, there are single products such as resistors, varistors, thermistors, inductors and so on and arrays composed of these elements.

The outer electrodes for an electronic device are usually formed as follows. As shown in FIG. 3, a paste of electric-conductive material (hereinbelow, referred to simply as a conductive paste) containing Ag or Ag—Pd or a conductive paste containing Cu is applied to both ends of a ceramic element 1 followed by baking to thereby form undercoat layers 2a as baked conductive layers; an intermediate Ni plating layer 2b is formed on each of the undercoat layers 2a, and a Sn-containing plating surface layer 2c which contains Sn or Sn—Pb is formed on each of the intermediate layers 2b. The reason why the undercoat layers are formed is because it is difficult to conduct electrolytic plating directly on the ceramic element. However, the plating should be made thin as possible since Ag is expensive and cost for plating has to be reduced. The intermediate layer is formed as a barrier layer to the Sn-containing plating layer since when the intermediate layer is formed directly on the Sn-containing plating layer, there takes place a so-called leaching phenomenon wherein Ag or Cu in the undercoat layer dissolves in the plating layer. The intermediate layer is in particular effective when the undercoat layer is Sn. The Sn-containing surface layer is to improve solderability in a case that a structural element is mounted on the printed circuit substrate.

The ceramic electronic devices having the outer electrodes are sometimes used for a long time under severe conditions of high temperature and high humidity in a state that a voltage is applied across the outer electrodes 2 as shown in FIG. 3, or in a state that there is a voltage difference between the power line 6a and the ferrite bead supplied with a current, as show in FIG. 4. In such case, there takes place a so-called ion-migration phenomenon wherein Ag or Cu contained in the undercoat layers of the outer electrodes gradually diffuses to the solder lands of the printed circuit substrate 3 or 6 through the soldered portions. This easily causes reduction in the voltage strength or short-circuiting between the opposing solder lands 3a or 6b or between one of these solder lands and an adjacent circuit wiring (not shown).

SUMMARY OF THE INVENTION

It is an object of the present invention to provide an electronic device with outer electrodes wherein the undercoat layer is protected from air or the like and a circuit module including the electronic device.

It is an object of the present invention to provide an electronic device with outer electrodes which are mounted on a printed circuit substrate and which minimizes occurrence of ion-migration of metal contained in the undercoat layer even when the electronic device is used under the application of a voltage for a long time and a circuit module provided with the electronic device.

In accordance with a first aspect of the present invention, there is provided an electronic device comprising a ceramic element and outer electrodes wherein each of the outer electrodes comprises an undercoat layer, an intermediate metal plating layer comprising at least one layer formed on the undercoat layer and a surface layer formed by metal plating which is formed on the intermediate metal plating layer; the intermediate metal plating layer is extended beyond the edge of the periphery of the undercoat layer to a surface portion of the ceramic element; and the undercoat layer is entirely coated with the intermediate metal plating layer.

In a second aspect, there is provided an electronic device according to the first aspect, wherein the intermediate metal plating layer is extended to a surface portion of the ceramic element with a width of extension of 3 μm or more.

In a third aspect, there is provided an electronic device according to the second aspect, wherein the width of extension is 5 μm or more.

In a fourth aspect, there is provided an electronic device according to the first aspect, wherein the intermediate metal plating layer is extended to a surface portion of the ceramic element with a width of extension which is larger than a film thickness of the intermediate metal plating layer at a position in the edge of the periphery of the undercoat layer.

In a fifth aspect, there is provided an electronic device according to the fourth aspect, wherein the width of extension is 1.1 times or more as large as a film thickness of the intermediate metal plating layer at a position in the edge of the periphery of the undercoat layer.

In a sixth aspect, there is provided an electronic device according to the fifth aspect, wherein the width of extension is 1.5 times or more.

In a seventh aspect, there is provided an electronic device according to the first aspect, wherein a length from the ceramic element to the contacting surface between the intermediate metal plating layer and the surface layer along a normal line from the ceramic element at a position in the edge of the periphery of the undercoat layer is smaller than a length from the ceramic element to the contacting surface between the undercoat layer and the intermediate metal plating layer along a normal line from the ceramic element at a position which is shifted toward an edge of the ceramic element by an amount of extension from the position in the edge of the periphery of the undercoat layer.

In an eighth aspect, there is provided an electronic device according to the seventh aspect, wherein the length of the former is 0.9 times as large as the length of the later.

In a ninth aspect, there is provided an electronic device according to the first aspect, wherein the undercoat layer is a Ag-containing layer; the intermediate metal plating layer comprises at least one selected from the group consisting of a Ni layer and a Cu layer; and the surface layer is a Sn-containing layer.

In a tenth aspect, there is provided the electronic device according to the first aspect, the undercoat layer is a Cu-containing layer; the intermediate metal plating layer is a Ni layer; and the surface layer is a Sn-containing layer.

In an eleventh aspect, there is provided a circuit module comprising a substrate with a printed circuit, lands formed on the substrate and an electronic device mounted on the lands, wherein the electronic device comprises a ceramic element and outer electrodes; each of the outer electrodes comprises an undercoat layer, an intermediate metal plating layer comprising at least one layer formed on the undercoat layer and a surface layer formed by metal plating which is formed on the intermediate metal plating layer; the intermediate metal plating layer is extended beyond the edge of the periphery of the undercoat layer to a surface portion of the ceramic element; and the undercoat layer is entirely coated with the intermediate metal plating layer.

In a twelfth aspect, there is provided a circuit module according to the eleventh aspect, wherein the intermediate metal plating layer is extended to a surface portion of the ceramic element with a width of extension of 3 $\mu$m or more.

In a thirteenth aspect, there is provided a circuit module according to the twelfth aspect, wherein the width of extension is 5 $\mu$m or more.

In a fourteenth aspect, there is provided a circuit module according to the eleventh aspect, wherein the intermediate metal plating layer is extended to a surface portion of the ceramic element with a width of extension which is larger than a film thickness of the intermediate metal plating layer at a position in the edge of the periphery of the undercoat layer.

In a fifteenth aspect, there is provided a circuit module according to the fourteenth aspect, wherein the width of extension is 1.1 times or more as large as a film thickness of the intermediate metal plating layer at a position in the edge of the periphery of the undercoat layer.

In a sixteenth aspect, there is provided a circuit module according to the fifteenth aspect, wherein the width of extension is 1.5 times or more.

In a seventeenth aspect, there is provided a circuit module according to the eleventh aspect, wherein a length from the ceramic element to the contacting surface between the intermediate metal plating layer and the surface layer along a normal line from the ceramic element at a position in the edge of the periphery of the undercoat layer is smaller than a length from the ceramic element to the contacting surface between the undercoat layer and the intermediate metal plating layer along a normal line from the ceramic element at a position which is shifted toward an edge of the ceramic element by an amount of extension from the position in the edge of the periphery of the undercoat layer.

In an eighteenth aspect, there is provided a circuit module according to the seventeenth aspect, wherein the length of the former is 0.9 times as large as the length of the later.

In a nineteenth aspect, there is provided a circuit module according to the eleventh aspect, wherein a power source line is formed near the lands.

In a twentieth aspect, there is provided a circuit module according to the eleventh aspect, wherein the undercoat layer is a Ag-containing layer; the intermediate metal plating layer comprises at least one selected from the group consisting of a Ni layer and a Cu layer; and the surface layer is a Sn-containing layer.

In a twenty-first aspect, there is provided a circuit module according to the eleventh aspect, wherein the undercoat layer is a Cu-containing layer; the intermediate metal plating layer is a Ni layer; and the surface layer is a Sn-containing layer.

In the present invention, "an intermediate metal plating layer comprising at least one layer formed on the undercoat layer" indicates an intermediate plating layer comprising at least one layer between a Ni-containing layer and a Cu-containing layer. Although either one of Ni plating layer or Cu plating layer can be used, a lamination of both the layers may be used.

As "an undercoat layer" used in the present invention, a Ag-containing layer which contains, for example, Ag or Ag—Pd, or a Cu-containing layer is exemplified. Further, as "a surface layer formed by metal plating", there is a Sn-containing layer such as a layer containing Sn solely or a solder layer of Sn—Pb.

For "plating", either electrolytic plating or electroless plating may be used, or both methods may be used together.

In the present invention, in order not to cause the ion-migration of Ag from the undercoat layer containing Ag, or in order not to cause the ion-migration of Cu from the undercoat layer containing Cu, an intermediate plating layer c should be extended to a front surface portion of a ceramic element a with a width of extension L of 3 $\mu$m or more, preferably, 5 $\mu$m or more as shown in FIG. 1. Further, the dimension of the width of extension L should be larger than the dimension of a film thickness D of the intermediate plating layer c at an edge portion of the undercoat layer. Specifically, the dimension is 1.1 times or more, preferably 1.5 times or more with respect to the film thickness D of the intermediate plating layer c. Further, it is preferable that a length h1 of a normal line from the surface of the ceramic element a at a position in the edge of the peripheral portion of the undercoat layer b to a contacting surface between the intermediate plating layer c and the surface layer d is smaller than a length h2 of a normal line from the surface of the ceramic element a at a position shifted from the edge of the peripheral portion of the undercoat layer b toward the edge of the substrate by the width of extension L. Specifically, the length h1 should be 0.9 times or less as large as the length h2. Either type of the voltage operable mode or the current operable mode may be used for the electronic device of the present invention.

In the circuit module according to the present invention, the outer electrodes provided in an electronic device are connected by soldering to the solder lands on a printed circuit substrate. Accordingly, a portion of the surface layer, formed by plating, of the outer electrodes is fused by solder at the time of soldering and is mixed with the solder. In this specification, the portion is referred to as "a surface layer" and is distinguished from "a surface layer formed by plating" in the outer electrodes. The circuit module includes the embodiments as shown in FIGS. 3 and 4 as described with respect to prior art, and a power line may be included therein.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
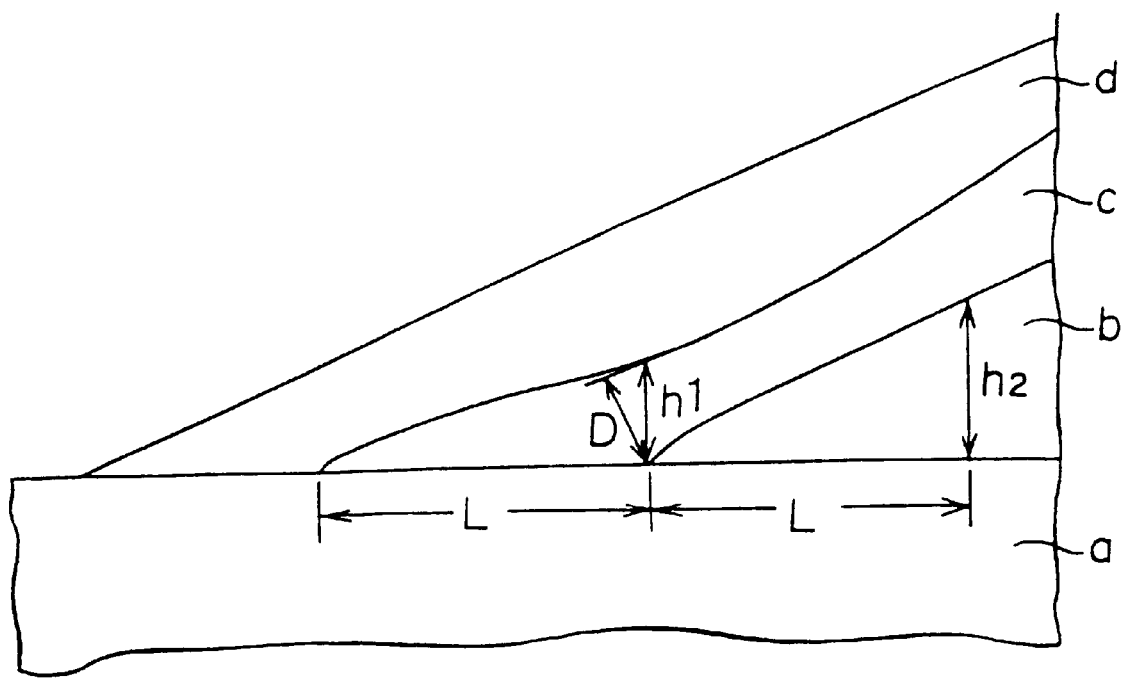
FIG. 1 is a diagram for explaining an embodiment of the structure of an outer electrode for an electronic device according to the present invention.

In the following, preferred embodiments of the present invention will be described with reference to the drawings wherein the same reference numerals designate the same or corresponding parts.

EXAMPLE 1

Figure 2A:
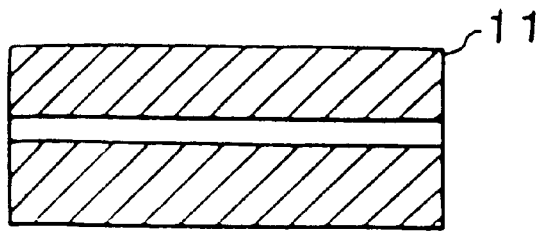
FIGS. 2a through 2d are diagrams showing manufacturing steps of a ferrite bead as an electronic device according to an embodiment of the present invention.
Figure 2B:
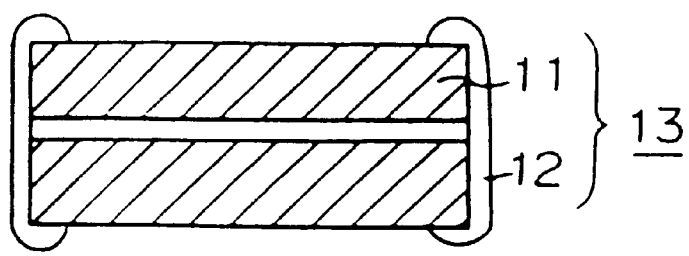

A ceramic element 11 for a chip type ferrite bead, having a Ag conductor at its central axis was prepared (FIG. 2a). A paste of conductive material (Ag—Pd powder of 75 parts by weight, ethyl cellulose of 5 parts by weight and terpineol of 20 parts by weight) is applied to both ends of the ceramic element 11 by screen printing, and the paste was heated at 800° C. for 10 min to form Ag—Pd baked conductive films 12 whereby a ceramic element 13 with Ag—Pd baked conductive films 13 was formed (FIG. 2b).

Figure 5:
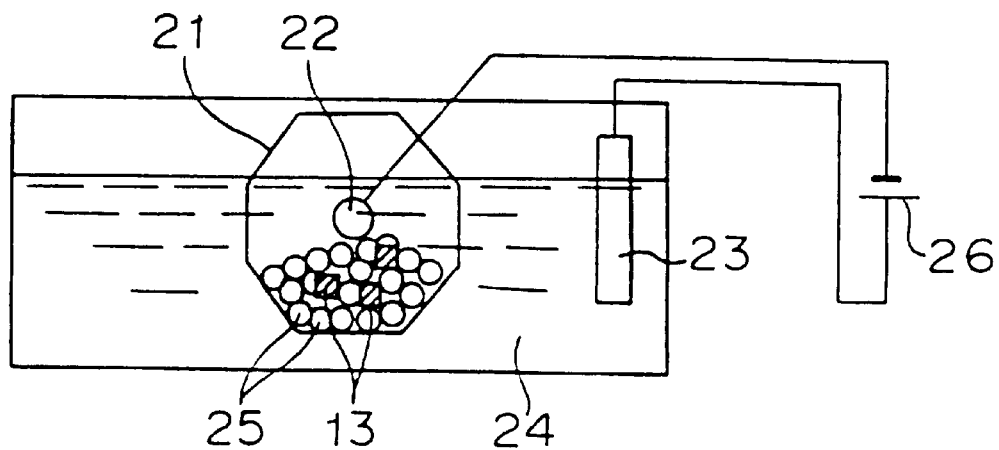
FIG. 5 is a diagram partly in cross-section showing a barrel type electrolytic plating apparatus.

A barrel type electrolytic plating apparatus was used wherein an anode 23 and a mesh barrel 21 were placed in a Ni plating bath 24 so that a cathode 22 in the mesh barrel 21 electrically opposed the anode 23 as shown in FIG. 5. A number of ceramic elements 13 with Ag—Pd baked conductive films and a dummy (medium balls 25 of a particulate conductive material, if the number of the ceramic elements 13 is small, were put in the barrel 21 while the ceramic elements 13 and the dummy were agitated, and electrolytic Ni plating was conducted. In the Ni plating, the temperature of the solution was 50° C., the current density was 0.3 A/cm$^2$ and the current conducting time was 60 min. In FIG. 5, reference numeral 26 designates a d.c. power source.

Figure 2C:
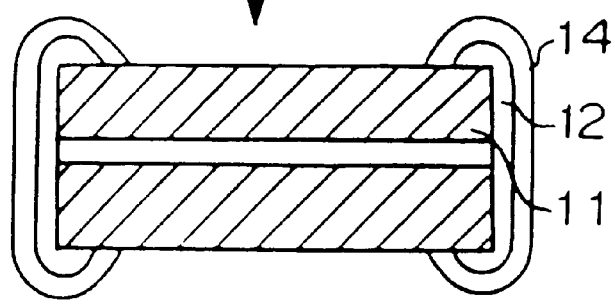

As a result of the electrolytic Ni plating, a Ni plating film 14 which covers the entirety of each of the Ag—Pd baked conductive films 12 formed on the ceramic element 13 with Ag—Pd baked conductive films and is extended to both end portions of the ceramic element 11 so as to cover the edge of the periphery of each of the Ag—Pd baked conductive films 12 was formed as shown in FIG. 2c.

Figure 2D:
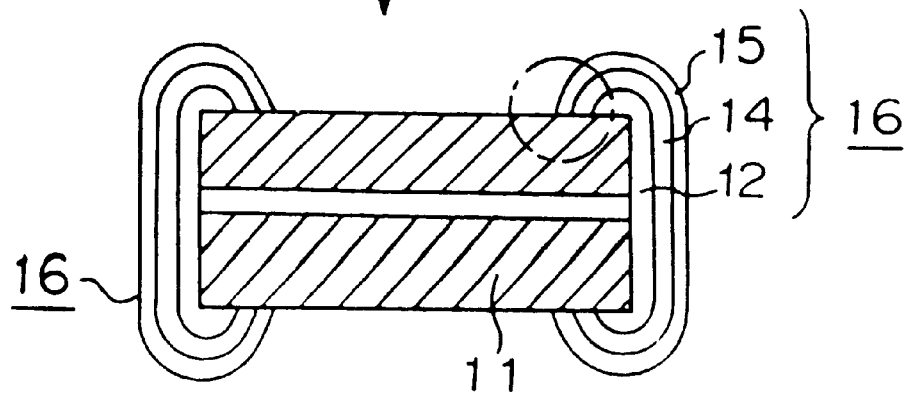

Another barrel type electroplating apparatus having a similar construction as described above was used to conduct electrolytic plating wherein a solder plating solution was used, the temperature of the solution was 40° C. and the current density was 0.3 A/cm$^2$ to thereby form solder plating films 15 on the Ni plating films 14 as shown in FIG. 2d.

Thus, a chip type ferrite bead of a size of 3.2 mm×1.6 mm×1.1 mm which had outer electrodes 16 at both ends of the ceramic element 11, each of the electrodes comprising an undercoat layer composed of the Ag—Pd baked conductive film 12, an intermediate layer composed of the Ni plating film 14 and a surface layer composed of the solder plating film 15 was prepared.

One of the outer electrodes of the chip type ferrite bead was polished, and an electron photomicrograph of 3,500 magnifications was taken to a cross-sectional area of the portion surrounded by a circle in FIG. 2d. As a result, it was found that the film thickness of the Ag—Pd baked conductive film 12 was 30 μm (constant portion), the film thickness of the Ni plating film 14 at the edge of the film 12 (which corresponds to D in FIG. 1) was 2.5 μm, the film thickness of the solder plating film 15 (constant portion) was 3.2 μm, a width of extension (which corresponds to L in FIG. 1) of the Ni plating film 14 at the edge of the periphery of the Ag—Pd baked conductive film 12 was 3.5 μm, a length of a normal line from the ceramic element 11 at an edge of the periphery of the Ag—Pd baked conductive film 12 to the contacting surface between the Ni plating film 14 and the solder plating film 15 (which corresponds to h1 in FIG. 1) was 2.8 μm, a length of a normal line from the ceramic element 11 at an edge of the periphery of the Ag—Pd baked conductive film 12, the normal line being at a position shifted toward the edge of the ceramic element by the width of extension (corresponding to L in FIG. 1) to the contacting surface between the Ag—Pd baked conductive film 12 and the Ni plating film 14 (which corresponds to h2 in FIG. 1) was 3.2 μm, and the ratio of the lengths (which corresponds to h1/h2 in FIG. 1) was 0.875.

Figure 4:
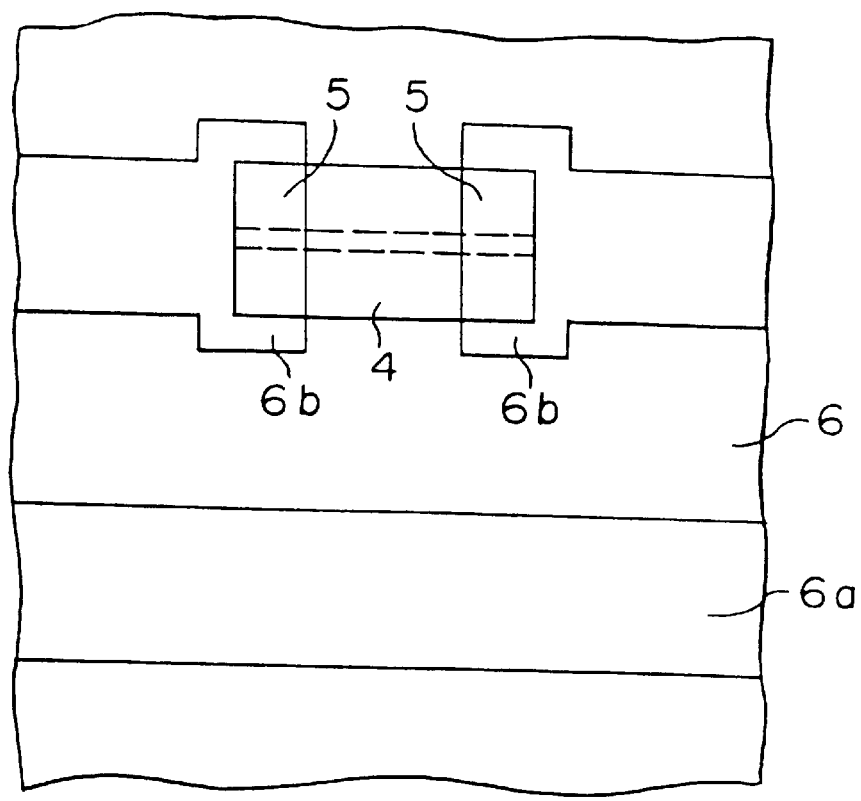
FIG. 4 is a plane view partly omitted showing a state of use of a chip ferrite bead.

Ferrite beads which were prepared in the same manner as above were connected to printed circuit substrates 6 by soldering to prepare circuit substrates for test as shown in FIG. 4. The circuit substrates were placed under the conditions of 85° C. and 85% RH (relative humidity), and a voltage of d.c. of 10V was applied across a power source line 6a and solder lands 6b for 100 hours. Observation was conducted with use of a magnifying glass as to whether or not there is the migration of Ag. As a result, no migration of Ag was found.

COMPARATIVE EXAMPLE 1

A chip ferrite bead was prepared in the same manner as in Example 1 except that the current density was 0.15 A/cm$^2$ and the current conducting time was 60 min in the Ni electrolytic plating conditions, and an electron photomicrograph was taken in the same manner as in Example 1. As a result, the film thickness corresponding to D in FIG. 1 was 1.3 μm, the width of extension corresponding to L in FIG. 1 was 1.8 μm, the length corresponding to h1 in FIG. 1 was 1.4 μm, the length corresponding to h2 in FIG. 1 was 1.5 μm, and the ratio corresponding to h1/h2 in FIG. 1 was 0.93.

Circuit substrates for test were prepared in the same manner as in Example 1 to observe the migration of Ag. As a result, 8 circuit substrates having the migration were found.

EXAMPLE 2

A chip ferrite bead was prepared in the same manner as in Example 1 except that the current density was 0.15 A/cm² and the current conducting time was 120 min under the electrolytic plating conditions. An electron photomicrograph was taken to examine the chip ferrite in the same manner as Example 1. As a result, the film thickness corresponding to D in FIG. 1 was 2.8 μm, the width of extension corresponding to L in FIG. 1 was 5.2 μm, the length corresponding to h1 in FIG. 1 was 3.1 μm, the length corresponding to h2 in FIG. 1 was 4.0 μm, and the ratio corresponding to h1/h2 in FIG. 1 was 0.775.

Circuit substrates for test were prepared in the same manner as Example 1 to observe the migration of Ag. As a result, no migration was found.

EXAMPLE 3

A chip ferrite bead was prepared in the same manner as Example 1 except that a Cu plating film was formed, instead of the Ni plating film, by dipping the ceramic element 13 with Ag—Pd baked conductive films (FIG. 2b) into an electroless Cu plating solution having the composition described below for 40 min.

| | |
|---|---|
| CuSO$_4$.5H$_2$O | 8.75 g/l (liter) |
| Rochelle salt | 37.50 g/l |
| NaOH | 11.30 g/l |
| Formaldehyde | 85. ml/l |

An electron photomicrograph was taken for examination in the same as Example 1. As a result, the film thickness corresponding to D in FIG. 1 was 2.0 μm, the width of extension corresponding to L in FIG. 1 was 3.1 μm, the length corresponding to h1 in FIG. 1 was 2.3 μm, the length corresponding to h2 in FIG. 1 was 3.0 μm, and the ratio corresponding to h1/h2 in FIG. 1 was 0.77.

Circuit substrates for test were prepared in the same manner as Example 1 to observe the migration of Ag. As a result, no migration was found in the circuit substrates for test.

COMPARATIVE EXAMPLE 2

A chip ferrite bead was prepared in the same manner as Example 3 except that the Cu plating film was prepared by dipping the ceramic element 13 with Ag—Pd baked conductive films in the plating solution for 15 min. An electron photomicrograph was taken for examination in the same manner as Example 1. As a result, the film thickness corresponding to D in FIG. 1 was 0.9 μm, the width of extension corresponding to L in FIG. 1 was 1.2 μm the length corresponding to h1 in FIG. 1 was 1.0 μm, the length corresponding to h2 in FIG. 1 was 1.0 μm, and the ratio corresponding to h1/h2 in FIG. 1 was 1.0.

Circuit substrates for test were prepared in the same manner as Example 1 to observe the migration of Ag. As a result, 9 circuit substrates having the migration were found.

EXAMPLE 4

A chip ferrite bead was prepared in the same manner as Example 3 except that the concentration of CuSO$_4$.5H$_2$O was 13.0 g/l instead of 8.75 g/l. An electron photomicrograph was taken for examination in the same manner as Example 1. As a result, the film thickness corresponding to D in FIG. 1 was 2.2 μm, the width of extension corresponding to L in FIG. 1 was 4.1 μm, the length corresponding to h1 in FIG. 1 was 2.5 μm, the length corresponding to h2 in FIG. 1 was 2.9 μm, and the ratio corresponding to h1/h2 in FIG. 1 was 0.86.

Circuit substrates for test were prepared in the same manner as Example 1 to observe the migration of Ag. As a result, no migration was found.

EXAMPLE 5

Figure 3:
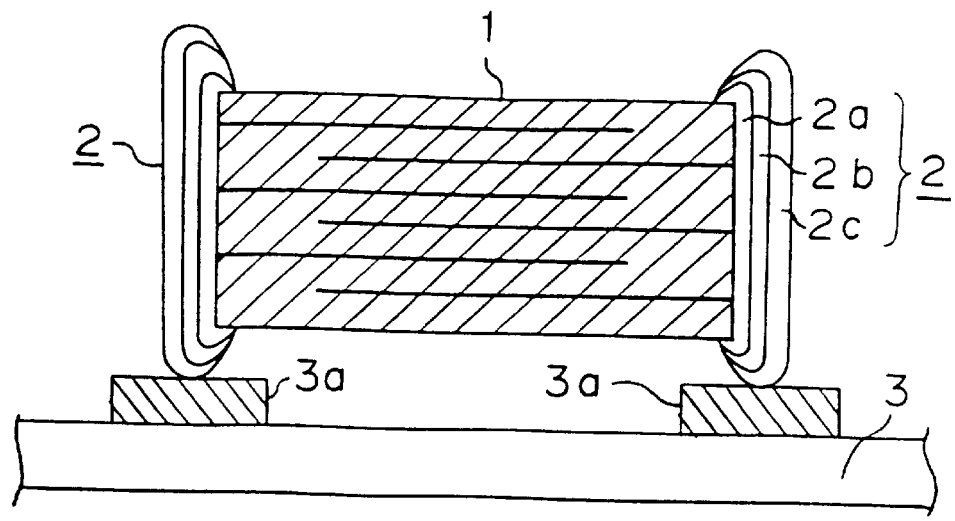
FIG. 3 is an enlarged cross-sectional view partly omitted which shows a state of use of a chip multilayer ceramic capacitor.

A chip type multilayer ceramic capacitor having outer electrodes as shown in FIG. 3 was prepared in the same manner as Example 1. An electron photomicrograph was taken for examination in the same manner as Example 1. As a result, substantially the same result as in Example 1 was obtained.

Circuit substrates for test were prepared in the same manner as Example 1, each of which was connected with the chip multilayer ceramic capacitor by soldering as shown in FIG. 3. Under the same conditions as Example 1, the voltage was applied between the solder lands 3a of each of the circuit substrates to observe the migration of Ag. As a result, no migration was found in the circuit substrates.

COMPARATIVE EXAMPLE 3

A chip multilayer ceramic capacitor with outer electrodes was prepared in the same manner as Comparative Example 1 except that chip ceramic capacitor obtained in Example 5 was used instead of the chip ferrite bead. An electron photomicrograph was taken for examination in the same manner as Example 1. As a result, the film thickness corresponding to D in FIG. 1 was 1.2 μm, the width of extension corresponding to L in FIG. 1 was 1.6 μm, the length corresponding to h1 in FIG. 1 was 1.2 μm, the length corresponding to h2 in FIG. 1 was 1.3 μm, and the ratio corresponding to h1/h2 in FIG. 1 was 0.92.

Circuit substrates for test were prepared in the same manner as Example 1 to observe the migration of Ag.

As a result, the migration was found in 10 circuit substrates.

EXAMPLE 6

A ceramic element 11 for a chip ferrite bead, having a Ag conductor at its central axis was prepared (FIG. 2a). A conductive paste (Cu powder of 78 parts by weight, ethyl cellulose of 5 parts by weight and terpineol of 17 parts by weight) was coated by screen printing to both end portions of the element, and the paste was baked at 700° C. for 10 min to prepare Cu baked conducting films 12, thus, a ceramic element 13 with Cu baked conducting films was prepared (FIG. 2b). Then, electrolytic plating was conducted to the ceramic element 13 under the same conditions as Example 1 to form Ni plating films 14 which cover the entirety of the Cu baked conducting films 12 on the ceramic element 13 with Cu baked conducting films and which are extended onto the ceramic element 11 to edges of the peripheries of the Cu baked conducting films.

Solder plating films 15 were formed on the Ni plating films 14 by electrolytic plating with use of another barrel type electrolytic plating apparatus wherein a solder plating solution was used, the temperature of the solution was 40° C. and the current density was 0.3 A/cm² (FIG. 2c).

Thus, a chip ferrite bead of a size of 3.2 mm×1.6 mm×1.1 mm having outer electrodes 16 at both ends of the ceramic element 11, each of the electrodes comprising an undercoat layer composed of the Cu baked conducting film 12, an intermediate layer composed of the Ni plating film 14 and a surface layer composed of the solder plating film 15, was prepared.

An electron photomicrograph of 3,500 magnifications was taken to a cross-sectional area of the portion surrounded by a circle as shown in FIG. 2d. As a result, the film thickness of the Cu baked conductive film 12 was 35 $\mu$m (constant portion), the film thickness of the Ni plating film 14 at the edge portion (corresponding to D in FIG. 1) was 2.8 $\mu$m, the film thickness of the solder plating film 15 (constant portion) was 3.3 $\mu$m, the width of extension of the Ni plating film 14 from an edge of the periphery of the Cu baked conductive film 12 (which corresponds to L in FIG. 1) was 3.8 $\mu$m, the length of the normal line from an edge of the periphery of the Cu baked conductive film 12 on the ceramic substrate to the contacting surface between the Ni plating film 14 and the solder plating film 15 (corresponding to h1 in FIG. 1) was 3.1 $\mu$m, the length of a normal line from the surface of the ceramic element 11 at a position shifted by the width of extension from an edge of the periphery of the Cu baked conductive film 12 to the contacting surface between the Cu baked conductive film 12 and the Ni plating film 14 (corresponding to h2 in FIG. 1) was 3.5 $\mu$m, and the ratio of the lengths (corresponding to h1/h2 in FIG. 1) was 0.89.

Circuit substrates 6 for test were prepared, and the ferrite bead prepared as above-mentioned was connected by soldering to each of the printed circuit substrates 6 as shown in FIG. 4. The circuit substrates were placed under the conditions of 85° C. and 85% RH (relative humidity), and a voltage of d.c. of 10V is applied across the power source line 6a and the solder lands 6b for 300 hours to observe with magnifying glass as to the presence or absence of the migration of Cu. As a result, no migration of Cu was found.

COMPARATIVE EXAMPLE 4

A chip ferrite bead was prepared in the same manner as Example 6 except that the current density was 0.15 A/cm² and the current conducting time was 60 min under the Ni electrolytic plating conditions. An electron photomicrograph was taken for examination in the same manner as Example 1. As a result, the film thickness corresponding to D in FIG. 1 was 1.5 $\mu$m, the width of extension corresponding to L in FIG. 1 was 1.9 $\mu$m, the length corresponding to h1 in FIG. 1 was 1.6 $\mu$m, the length corresponding to h2 in FIG. 1 was 1.7 $\mu$m, and the ratio corresponding to h1/h2 in FIG. 1 was 0.94.

Circuit substrates for test were prepared in the same manner as Example 1 to observe the migration of Cu. As a result, 7 circuit substrates having the migration were found.

EXAMPLE 7

A chip ferrite bead was prepared in the same manner as Example 6 except that the current density was 0.15 A/cm² which was the same as Comparative Example 1 and the current conducting time was 120 min under the electrolytic plating conditions. An electron photomicrograph was taken for examination in the same manner as Example 1. As a result, the film thickness corresponding to D in FIG. 1 was 3.0 $\mu$m, the width of extension corresponding to L in FIG. 1 was 5.5 $\mu$m, the length corresponding to h1 in FIG. 1 was 3.3 $\mu$m, the length corresponding to h2 in FIG. 1 was 4.2 $\mu$m, and the ratio corresponding to h1/h2 in FIG. 1 was 0.79.

Circuit substrates for test were prepared in the same manner as Example 6 to observe the migration of Cu. As a result, no migration was found in the circuit substrates.

EXAMPLE 8

A chip multilayer ceramic capacitor with outer electrodes as shown in FIG. 3 was prepared in the same manner as Example 6. An electron photomicrograph was taken for examination in the same manner as Example 6. Substantially the same result as Example 6 was obtained.

Circuit substrates for test were prepared in the same manner as Example 1, and the chip multilayer ceramic capacitor thus obtained was connected by soldering to each of the circuit substrates as shown in FIG. 3. A voltage was applied between the solder lands 3a under the same condition as Example 1 to observe the migration of Cu. As a result, no migration was found.

COMPARATIVE EXAMPLE 5

A chip multilayer ceramic capacitor with outer electrodes was formed in the same manner as Comparative Example 4 except that the chip multilayer ceramic capacitor obtained in Example 8 was used instead of the chip ferrite bead. An electron photomicrograph was taken for examination in the same manner as Example 1. Substantially the same result as Comparative Example 1 was obtained.

Circuit substrates for test were prepared in the same manner as Example 1 to observe the migration of Cu. As a result, 10 circuit substrates having the migration were found.

Figure 6:
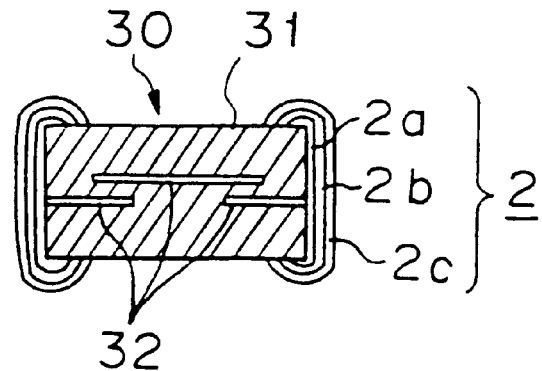
FIG. 6 is a diagram in cross-section of an embodiment of a chip thermistor according to the present invention.

FIG. 6 is a diagram showing an embodiment of a chip thermistor 30 according to the present invention. The chip thermistor 30 comprises a temperature nonlinear resistance material 31 supporting therein internal electrodes 32 and outer electrodes 2 at both ends, each of the electrodes comprising an undercoat layer 2a, an intermediate layer 2b and a surface layer 2c which are the same as those described before, and description is omitted.

Figure 7:
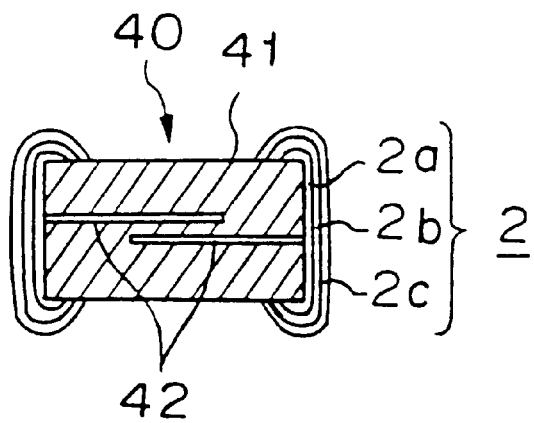
FIG. 7 is a diagram in cross-section of an embodiment of a chip varistor according to the present invention.

FIG. 7 is a diagram showing an embodiment of a chip varistor 40 according to the present invention. The chip varistor 40 comprises a voltage nonlinear resistance material 41 which supports therein internal electrodes 42 and the outer electrodes 2 formed at both ends of the voltage nonlinear resistance material 41.

Figure 8:
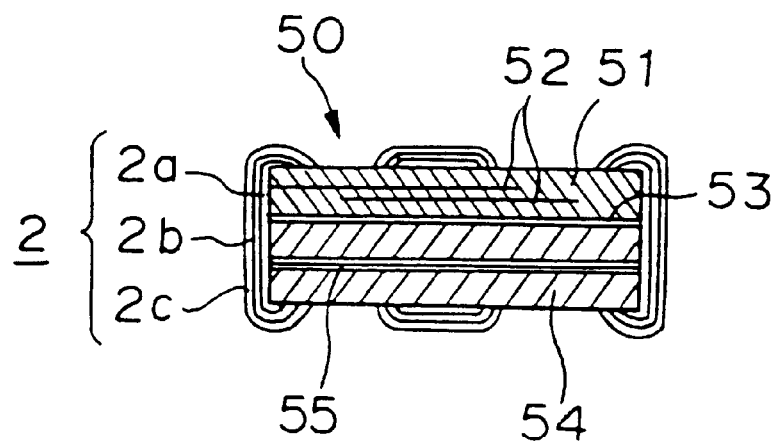
FIG. 8 is a diagram in cross-section of an embodiment of a chip LC composite device.
Figure 9:
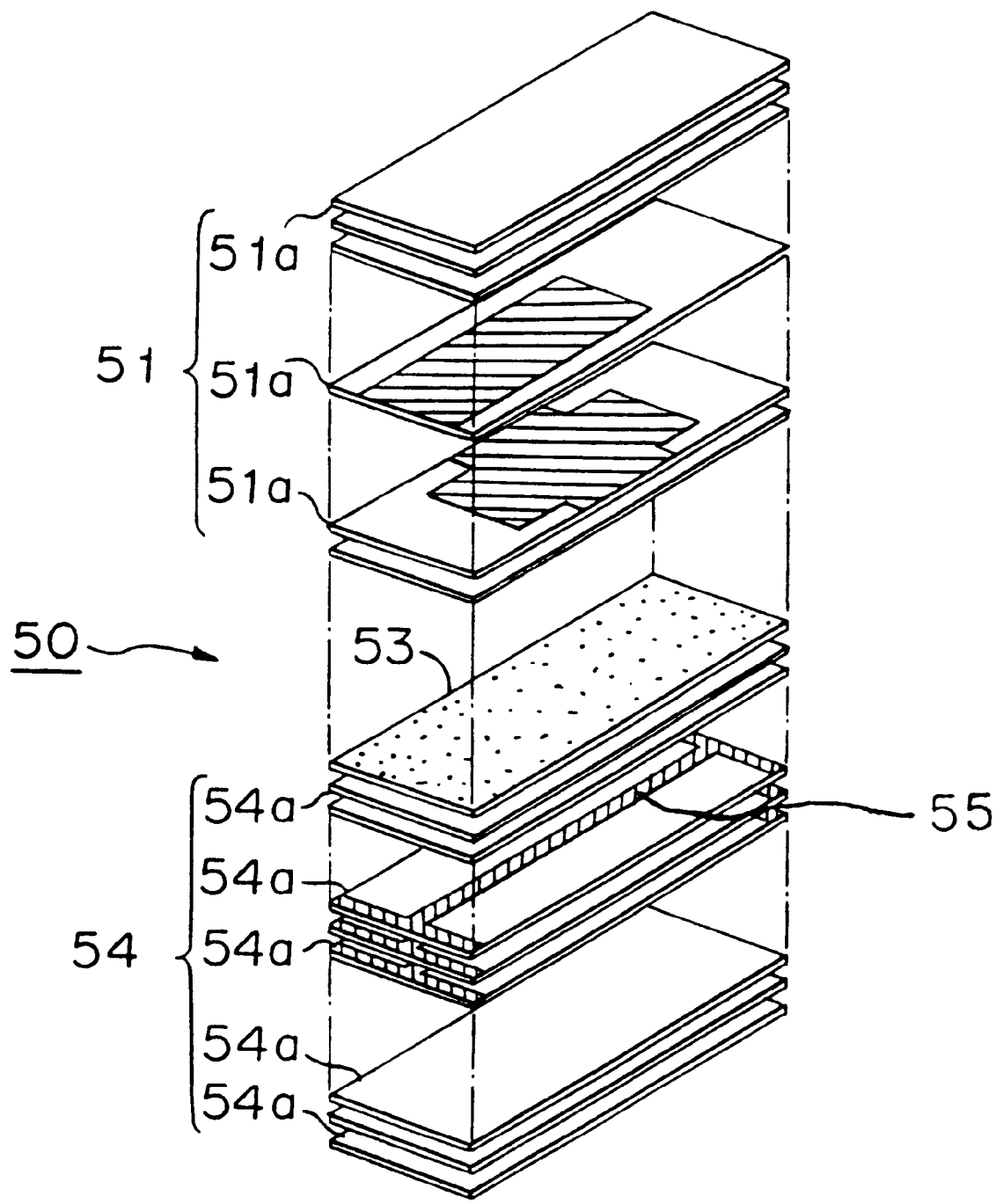
FIG. 9 is an exploded view of a part of the chip LC composite device.

FIGS. 8 and 9 are a diagram showing in cross-section of an embodiment of a chip LC composite device 50 of the present invention and an exploded view of a part of the chip LC composite device. The chip LC composite device 50 comprises a dielectric material 51 comprising a number of dielectric sheets 51a for supporting therein capacitor electrodes 52, an intermediate layer 53, a magnetic material 54 comprising a number of magnetic sheets 54a for holding inductor electrodes 55, and the outer electrodes 2 each of which comprises an undercoat layer 2a, an intermediate layer 2b and a surface layer 2c.

In accordance with an embodiment of the present invention, since the undercoat layer containing Ag is entirely covered with the intermediate layer of the Ni plating layer and/or the Cu plating layer, the undercoat layer containing Ag is isolated from outer air, and there is no influence of humidity or oxygen. Accordingly, ionization of Ag can be avoided even in a state that a voltage is applied to the outer electrodes in an atmosphere of high temperature and high humidity for a long term, whereby the migration of Ag is avoidable.

Further, in accordance with another embodiment of the present invention, since the undercoat layer containing Cu is entirely covered with the intermediate layer of the Ni plating layer, the undercoat layer containing Cu is isolated from outer air, and there is no influence of humidity and oxygen. Accordingly, ionization of Cu can be avoided even in a state that a voltage is applied to the outer electrodes in an atmosphere of high temperature and high humidity for a long term, and the migration of Cu is avoidable. Further, reliability on the circuit module of the present invention in which the electronic device having the outer electrodes is used can be increased and the service life of the circuit module can be prolonged.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic device comprising a ceramic element and outer electrodes, wherein each of the outer electrodes comprises an undercoat layer, an intermediate metal plating layer comprising at least one layer formed on the undercoat layer, and a surface layer formed on the intermediate metal plating layer;

the intermediate metal plating layer extends beyond an edge of a periphery of the undercoat layer to a surface portion of the ceramic element;

the undercoat layer is entirely coated with the intermediate metal plating layer; and the intermediate metal plating layer extends to the surface portion of the ceramic element with a width of extension which is larger than a film thickness of the intermediate metal plating layer at a position in the edge of the periphery of the undercoat layer.

2. An electronic device according to claim 1, wherein the width of extension is 3 $\mu$m or more.

3. An electronic device according to claim 2, wherein the width of extension is 5 $\mu$m or more.

4. An electronic device according to claim 1, wherein the width of extension is 1.1 times or more as large as the film thickness of the intermediate metal plating layer at a position in the edge of the periphery of the undercoat layer.

5. An electronic device according to claim 4, wherein the width of extension is 1.5 times or more.

6. An electronic device according to claim 1, wherein a first length, from the ceramic element to a contacting surface between the intermediate metal plating layer and the surface layer along a line normal to the ceramic element at a position in the edge of the periphery of the undercoat layer, is smaller than a second length, from the ceramic element to a contacting surface between the undercoat layer and the intermediate metal plating layer along a line normal to the ceramic element at a position which is shifted toward an edge of the ceramic element by an amount of extension from the position in the edge of the periphery of the undercoat layer.

7. An electronic device according to claim 6, wherein the first length is 0.9 times or less as large as the second length.

8. An electronic device according to claim 1, wherein the undercoat layer is a Ag-containing layer; the intermediate metal plating layer comprises at least one selected from the group consisting of a Ni layer and a Cu layer; and the surface layer is a Sn-containing layer.

9. An electronic device according to claim 1, wherein the undercoat layer is a Cu-containing layer; the intermediate metal plating layer is a Ni layer; and the surface layer is a Sn-containing layer.

10. A circuit module comprising a substrate with a printed circuit, lands formed on the substrate, and an electronic device mounted on the lands, wherein the electronic device comprises a ceramic element and outer electrodes;

each of the outer electrodes comprises an undercoat layer, an intermediate metal plating layer comprising at least one layer formed on the undercoat layer, and a surface layer formed on the intermediate metal plating layer;

the intermediate metal plating layer extends beyond an edge of a periphery of the undercoat layer to a surface portion of the ceramic element;

the undercoat layer is entirely coated with the intermediate metal plating layer; and the intermediate metal plating layer extends to the surface portion of the ceramic element with a width of extension which is larger than a film thickness of the intermediate metal plating layer at a position in the edge of the periphery of the undercoat layer.

11. A circuit module according to claim 10, wherein the width of extension is 3 $\mu$m or more.

12. A circuit module according to claim 11, wherein the width of extension is 5 $\mu$m or more.

13. A circuit module according to claim 10, wherein the width of extension is 1.1 times or more as large as a film thickness of the intermediate metal plating layer at a position in the edge of the periphery of the undercoat layer.

14. A circuit module according to claim 13, wherein the width of extension is 1.5 times or more.

15. A circuit module according to claim 10, wherein a first length, from the ceramic element to a contacting surface between the intermediate metal plating layer and the surface layer along a line normal to the ceramic element at a position in the edge of the periphery of the undercoat layer, is smaller than a second length, from the ceramic element to a contacting surface between the undercoat layer and the intermediate metal plating layer along a line normal to the ceramic element at a position which is shifted toward an edge of the ceramic element by an amount of extension from the position in the edge of the periphery of the undercoat layer.

16. A circuit module according to claim 15, wherein the first length is 0.9 times or less as large as the second length.

17. A circuit module according to claim 10, wherein a power source line is formed near the lands.

18. A circuit module according to claim 10, wherein the undercoat layer is a Ag-containing layer; the intermediate metal plating layer comprises at least one selected from the group consisting of a Ni layer and a Cu layer; and the surface layer is a Sn-containing layer.

19. A circuit module according to claim 10, wherein the undercoat layer is a Cu-containing layer; the intermediate metal plating layer is a Ni layer; and the surface layer is a Sn-containing layer.

* * * * *